(12) United States Patent
Luo et al.

(10) Patent No.: US 9,601,311 B2
(45) Date of Patent: Mar. 21, 2017

(54) LASER SDE EFFECT COMPENSATION BY ADAPTIVE TUNING

(71) Applicant: Hermes Microvision Inc., Hsinchu (TW)

(72) Inventors: Ying Luo, San Jose, CA (US); KuoFeng Tseng, San Jose, CA (US); Zhonghua Dong, Sunnyvale, CA (US)

(73) Assignee: HERMES MICROVISION INC., Hsinchu (TW)

( * ) Notice: Subject to any disclaimer, the term of this patent is extended or adjusted under 35 U.S.C. 154(b) by 0 days.

(21) Appl. No.: 15/060,576

(22) Filed: Mar. 3, 2016

(65) Prior Publication Data

US 2016/0260579 A1    Sep. 8, 2016

Related U.S. Application Data

(60) Provisional application No. 62/127,478, filed on Mar. 3, 2015.

(51) Int. Cl.
*H01J 37/00* (2006.01)
*H01J 37/28* (2006.01)

(52) U.S. Cl.
CPC ..... *H01J 37/28* (2013.01); *H01J 2237/20292* (2013.01); *H01J 2237/2817* (2013.01)

(58) Field of Classification Search
CPC ............ H01J 37/28; H01J 2237/20292; H01J 2237/2817
USPC ................... 250/306, 307, 310, 311
See application file for complete search history.

(56) References Cited

U.S. PATENT DOCUMENTS

2005/0214958 A1* 9/2005 Nakasuji ............. G01N 23/225
438/14

OTHER PUBLICATIONS

Renishaw PLC, "Advanced homodyne interferometry: a guide for OEM design engineers", 2006, Renishaw PLC, Gloucestershire, United Kingdom.

* cited by examiner

*Primary Examiner* — Michael Maskell
(74) *Attorney, Agent, or Firm* — WPAT, PC; Justin King

(57) ABSTRACT

Laser sub-divisional error (SDE) effect is compensated by using adaptive tuning. This compensated signal can be applied to position detection of stage in ebeam inspection tool, particularly for continuous moving stage.

17 Claims, 9 Drawing Sheets

LASER SDE EFFECT COMPENSATION BY ADAPTIVE TUNING

CLAIM OF PRIORITY

This application claims the benefit of priority of U.S. provisional application No. 62/127,478 entitled to Fang et al. filed Mar. 3, 2015 and entitled "Laser SDE Effect Compensation by Adaptive Tuning", the entire disclosures of which are incorporated herein by reference.

BACKGROUND OF THE INVENTION

1. Field of the Invention

The invention relates to a method for compensating the sub-divisional error effect by using adaptive tuning for the ebeam inspection tool during continuation scanning.

2. Description of the Prior Art

Defects are inevitably generated in the semiconductor process, which will greatly impact device performance, even failure. Device yield is thus impacted and cost is raised. Current defects can be classified into systematic defects and random defects in general. On the one hand, system defects infer defects will be found repeatedly and systematically in wafers, in which defect patterns can be used as reference in classification to determine root cause of which process incurs such defects. In order to increase semiconductor process yield, it is critical to enhance yield by monitoring, such as by using SEM (Scanning Electron Microscope), systematic defects highly appeared regions in mass production process to real time eliminate systematic defects. On the other hand, the non-systematic defects, random particle defects, are random residues left in wafers. Distributions and characteristic profiles are important references to distinguish systematic defects from non-systematic defects.

In order to enhance semiconductor process yield, defects have to be identified as soon as possible to prevent from impact pouring out. Optical microscope is used in conventional optical inspection which includes bright field inspection and dark field inspection. Every die on a wafer is scanned by optical beam and images of every die are generated and stored. A die-to-die compare is used to identify if there is any abnormal or defect with locations and images thereof.

When semiconductor nodes continue shrinking, dimensions of defect shrink also. Unimportant small defects in previous now become critical therefore. In sub-20 nanometer semiconductor node, optical inspection tool can't reveal any pattern more, even by using interference method, and hence SEM is the only way to identify defects. Nevertheless, due to the detected signal electrons in the SEM are secondary electrons, detection duration inevitably retrogrades significantly compared to that of optical inspection. Hence, it is an important issue to fast identify defects on a wafer by using SEM. An ebeam inspection tool, based on SEM, is currently best solution for defect inspection.

The ebeam inspection tool is to find or identify defects in the semiconductor process, and relative to review SEM, a large FOV (Field-of-View) and large beam current are commercial means to enhance inspection throughput. In order to obtain large FOV, a SORIL (Swing Objective Retarding Immersion Lens) system is applied commercially. Moreover, resolution is sometimes lowered, compared to review SEM, enough to capture defects.

In electron-beam inspection (EBI), as the image resolution specification is becoming higher and higher, the image vibration needs to be suppressed in lower and lower range, e.g., several nanometers or even sub-nanometer. In this course, position feedback accuracy is critical for the image vibration control, especially, on continuous scanning operation. Currently, high accuracy laser interferometer is commonly applied in the EBI for beam position measurement. Normally, one sinusoidal and one cosinusoidal signals are the output position information from the laser interferometer measurement. These two channel signals need to be interpolated to achieve nanometer or sub-nanometer position accuracy for the image location feedback. Ideally, these two signals from laser interferometer have the same magnitude and 90 degrees phase shift.

However, in reality, there are some differences in magnitude between these two analogue signals. Also, the phase shift between the both is not exact 90 degrees. Therefore, a sub-divisional error (SDE) is generated when these two signals are interpolated. Sub-Divisional Error (SDE) is cyclic and non-accumulative. It results from interpolation errors (not count loss), typically caused by imperfections in the analogue sine and cosine signals fed to the interpolator by the encoder's read head.

Especially on continuous scanning operation with slow moving speed, the single frequency disturbance from SDE is severe and obvious in image vibration analysis. This SDE effect in the laser position measurement needs to be compensated to achieve desired inspection performance.

SUMMARY OF THE INVENTION

This invention relates to a method for compensating the laser sub-division error (SDE) effect by using the adaptive tuning. The compensated signal can be applied to position detection of the stage in the ebeam inspection tool, and thus the desired inspection performance can be obtained.

One aspect of the invention includes a method for calculating a compensation signal for a sub-divisional error in an object detection, comprising steps of obtaining a detected position of the object, applying a positive gain to a tuning signal, integrating the tuning signal to a tuned signal, calculating a deviation between the tuned signal and the detected position, feeding the deviation to the tuning signal when variations of the tuned signal do not approach to a pre-determined value, and calculating compensation parameters by using the tuned signal when the variations of the tuned signal approach to the pre-determined value.

Another aspect of the invention includes a method for compensating a sub-divisional error in an object detection, comprising steps of obtaining a detected position of the object, applying a positive gain to a tuning signal, integrating the tuning signal to a tuned signal, calculating a deviation between the tuned signal and the detected position, feeding the deviation to the tuning signal when variations of the tuned signal do not approach to a pre-determined value, calculating compensation parameters by using the tuned signal when variations of the tuned signal approach to the pre-determined value, and compensating the sub-divisional error by subtracting the compensation parameters from the sub-divisional error in the object detection.

Still another aspect of the present invention includes a system for calculating a sub-divisional error in a stage of a charged particle beam inspection tool, comprising a parameter generator receiving a detected position and a sub-divisional error frequency, and generating a compensation parameter, and a signal generator receiving the compensation parameter from the parameter generator and sub-divisional error frequency to generate a compensation signal by using the tuned signal when variations of the tuned signal approach to a pre-determined value.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF EXAMPLE EMBODIMENTS

Figure 1:
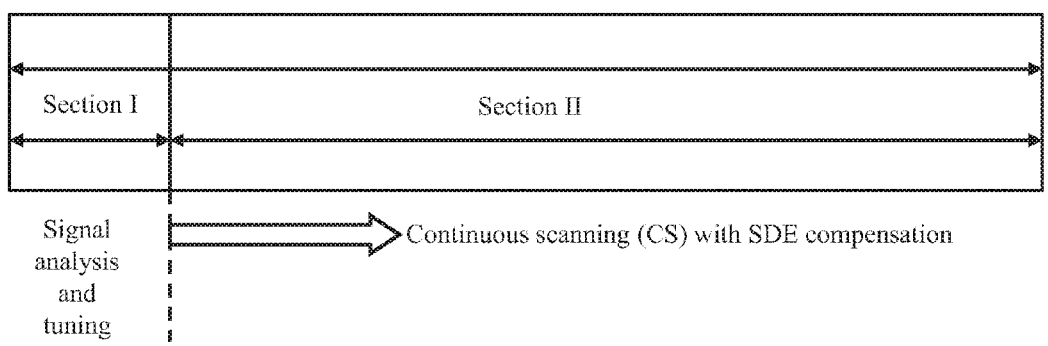
FIG. 1 is a schematic illustration of continuous scanning operation of a stage with SDE in accordance with an embodiment of the present invention.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

Adaptive tuning is the tuning method used by a controller which must adapt to a controlled system with parameters which vary, or are initially uncertain.

In EBI system, the SDE effect which is presented as a single frequency sinusoidal vibration in measured laser position signal is severe and obvious on the continuous scanning operation. In order to eliminate this SDE effect, an adaptive digital filtering function can be implemented for the laser measured position feedback signal after A/D conversion and interpolation of the two channel laser position measurement outputs. The diagram in FIG. 1 shows the overall structure of the continuous scanning operation with SDE compensation under constant speed movement. At the beginning of the operation as section I, stage moving speed can be constant or static, the position feedback is measured from laser interferometer for analysis and compensation parameter tuning. In this section, the SDE compensation is not implemented. After the tuning parameters become stable, the continuous scanning starts with SDE compensation as section II using the tuned parameters in section I.

Figure 2A:
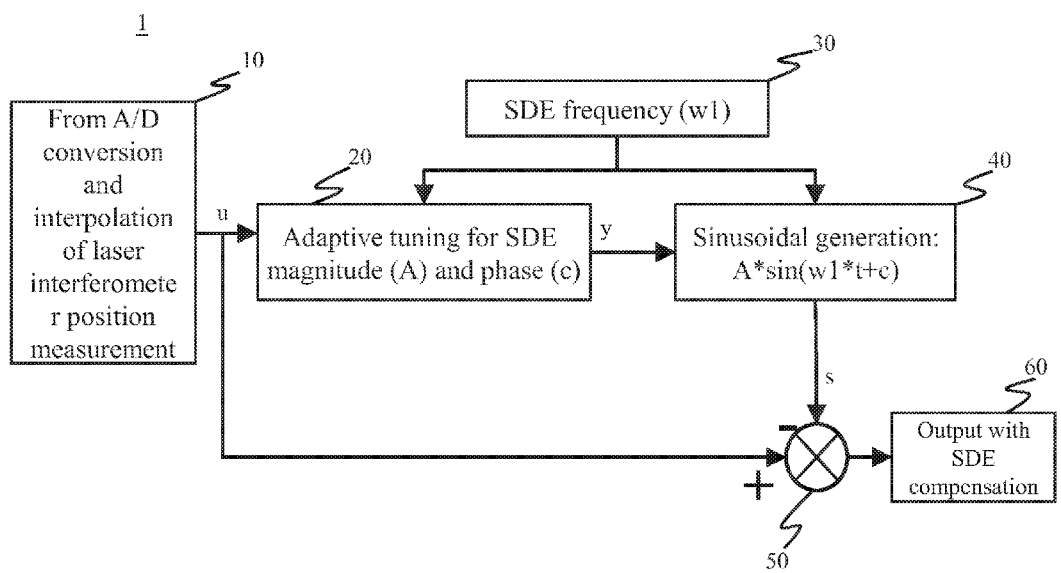
FIG. 2a is a schematic illustration of the implementation of laser position SDE compensation in accordance with an embodiment of the present invention.
Figure 2B:
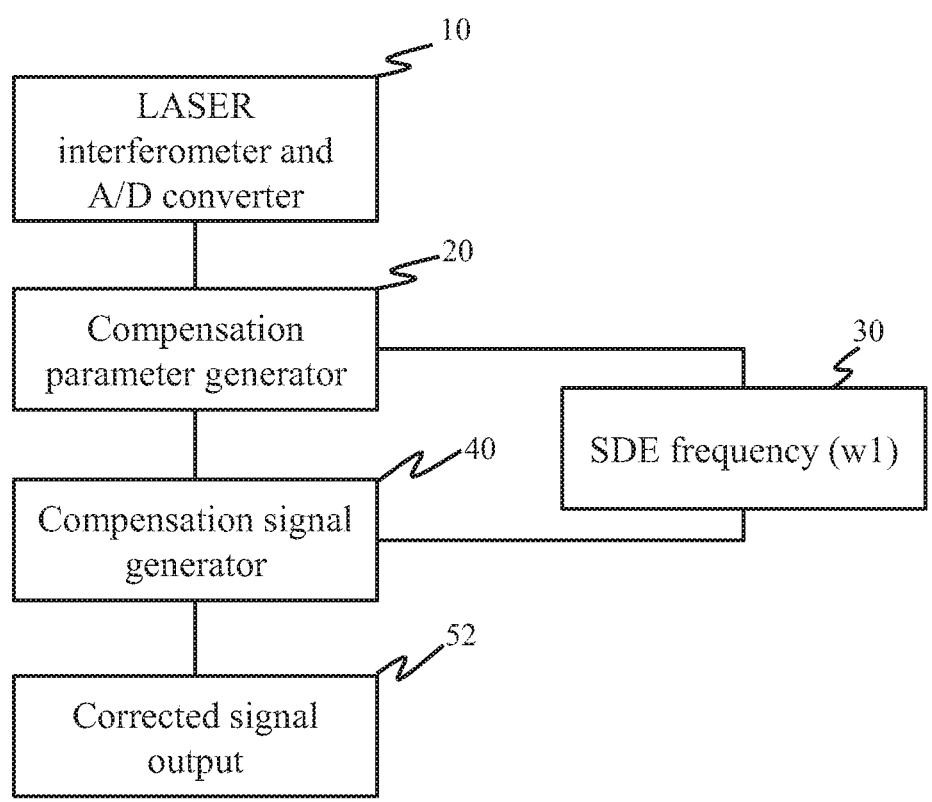
FIG. 2b is a diagram of the implementation of laser position SDE compensation in accordance with an embodiment of the present invention.

Please refer to FIG. 2a and FIG. 2b, which shows the overview diagram of the laser position signal SDE compensation implantation, and also refer to FIG. 1. It can be seen that, the raw input signal u is the position signal from laser interferometer after A/D conversion and interpolation 10. In section I of FIG. 1, the adaptive tunings for SDE magnitude (A) and phase (c) are implemented from u to y as shown in component 20 in FIG. 2a and FIG. 2b, where y is the output of the tuned parameters (A and c). At the end of section I of FIG. 1, the stable tuning parameter outputs are fixed. In continuous scanning as the section II of FIG. 1, the fixed parameters A and c are used for the sinusoidal compensation signal generation [$A*\sin(w1*t+c)$] with the given SDE frequency w1 shown in component 30 which can be calculated directly from the stage moving speed v and the wavelength r of the used laser beam, e.g. $w1=v/r$. After the sinusoidal compensation signal is generated, the adder-subtracter 50 is used to subtract the generated sinusoidal compensation signal from the raw input signal u, and therefore the raw input signal u is compensated and corrected for the SDE vibration, presented as the component 60. In other words, the corrected signal is output in the component 52 which involves the adder-subtracter 50 and the component 60.

Figure 3A:
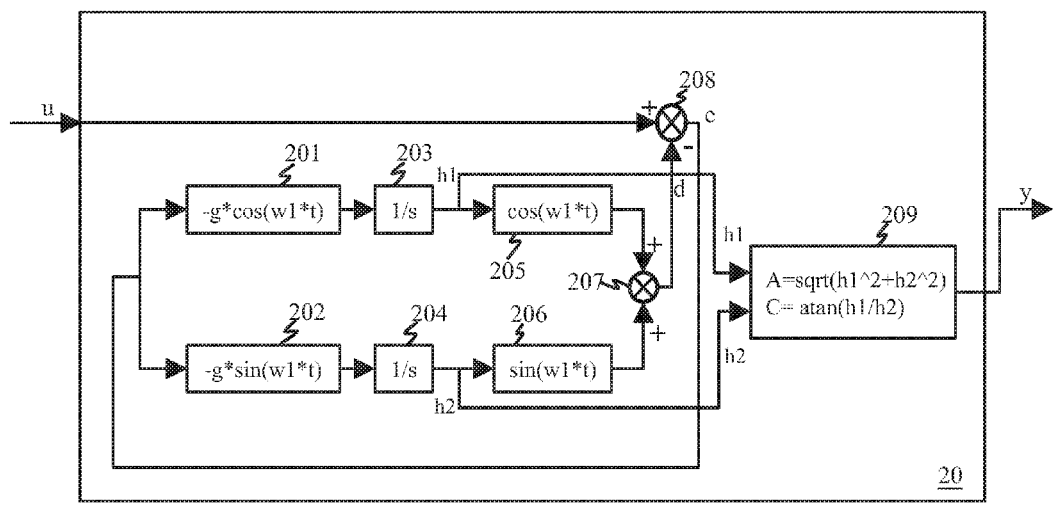
FIG. 3a is a schematic illustration of the implementation of SDE magnitude and phase adaptive tuning in accordance with an embodiment of the present invention.

In order to measure magnitude and phase of the SDE vibration in the feedback position signal from laser interferometer, an adaptive tuning scheme can be easily applied. The detailed implementation of this adaptive tuning scheme is shown in FIG. 3a. In FIG. 3a, first, the original SDE single frequency vibration is d0, and the d0 is assumed as: $d0=A0*\sin(w1*t+c0)=k1*\cos(w1*t)+k2*\sin(w1*t)$, where $k1=A0*\sin(c0)$ and $k2=A0*\cos(c0)$. The original SDE single frequency vibration d0 is calculated with the raw input signal u in the adder-subtracter 208 to obtain a first deviation value, and the first deviation value is output to the tuning signal generated units 201 and 202 for acquiring an estimated tuning signal. The integrators 203 and 204 receive, integrate, and output the estimated tuning signal to be the parameters h1 and h2. The parameters h1 and h2 are used to adaptively estimate the parameters k1 and k2 for the SDE vibration. The parameters h1 and h2 are output to the calculation units 205 and 206 for calculating the tuned signals. The tuned signals are transmitted to the adder 207 which calculates and transmits the integrated SDE single frequency vibration dl to the adder-subtracter 208. The adder-subtracter 208 computes a second deviation value according to the single frequency vibration d1. Then, the second deviation value is determined whether it is acceptable or not by determining variation of the tuned signals approach to a pre-determined value or not. If the second deviation value is acceptable, the parameters h1 and h2 are output to the compensation generator 209 to calculate the magnitude estimation A and the phase estimation c. The calculated results from the magnitude estimation A and the phase estimation c can be regarded as a corrected signal. The corrected signal is applied for compensating the SDE effect. By contrast, if the second deviation value is not acceptable, the second deviation value is fed back to the signal generated units 201, 202 and the integrators 203, 204 to obtain the parameters h1 and h2. The parameters h1 and h2 are output to the calculation units 205 and 206 to calculate other tuned signals. That other tuned signals are transmitted to the adder 207 which calculates and transmits the integrated SDE single frequency vibration d2 to the adder-subtracter 208. The adder-subtracter 208 computes a third deviation value according to the single frequency vibration d2, and the third deviation value is determined whether it is acceptable or not till the third deviation value can be acceptable.

The adaptive law is defined as $dh1/dt=-g*e*\cos(w1*t)$ and $dh2/dt=-g*e*\sin(w1*t)$, where $e=u-d$, $d=h1*\cos(w1*t)+h2*\sin(w1*t)$, and g is a positive adaptive gain value. According to the estimated parameters h1 and h2, the magnitude and phase estimation of the SDE vibration can be calculated as: $A=\text{sqrt}(h1^2+h2^2)$, $c=\arctan(h1/h2)$.

Figure 4:
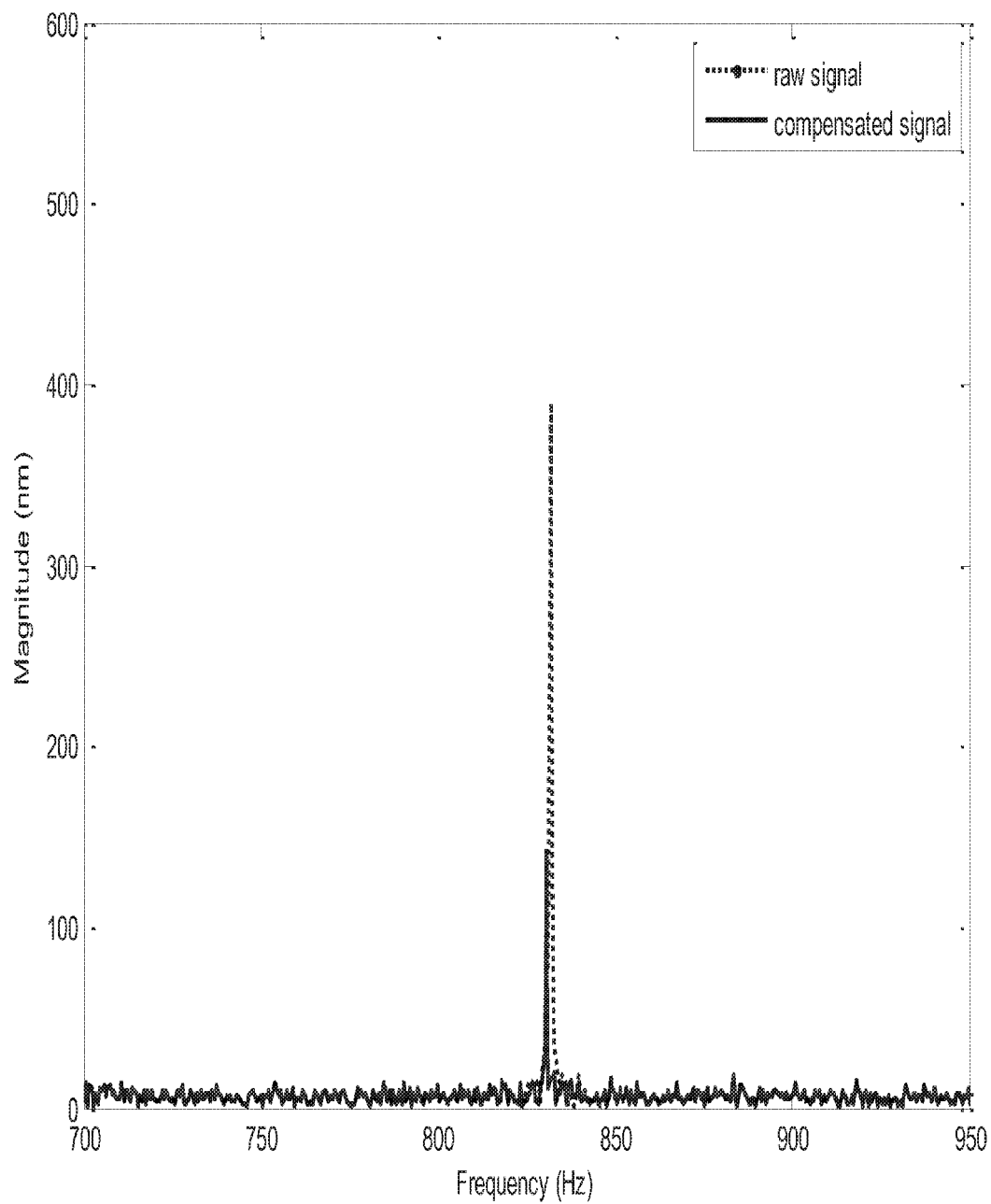
FIG. 4 is a compare result between raw signal and compensated signal in accordance with an embodiment of the present invention.

A: compensation magnitude, or first compensation parameter c: compensation phase, or second compensation parameter u: input raw signal, or detected signal, regarded as a position detected by a laser interferometer d0: tuning signal shown as $k1\cos(wt)+k2\sin(wt)$ d: tuned signal, shown as $h1\cos(wt)+h2\sin(wt)$ e: deviation shown as $e=u-d$ g: positive adaptive gain SDE: compensation with generated signal The estimation for magnitude estimation A and phase estimation c of the SDE vibration are fixed with stable values in the end of section I in FIG. 1. Then, as shown in FIG. 2, the SDE compensated signal s can be generated with the magnitude estimation A and the estimation phase c and the calculated frequency w1, where $s=A*\sin(w1*t+c)$ for the SDE compensation in continuous scanning operation. For example, as FIG. 4 shows, the compensation performance is illustrated by the frequency domain comparison between the raw input signal u and the compensated signal s. It is obvious that the compensated signal is almost match the raw signal.

Figure 3B:
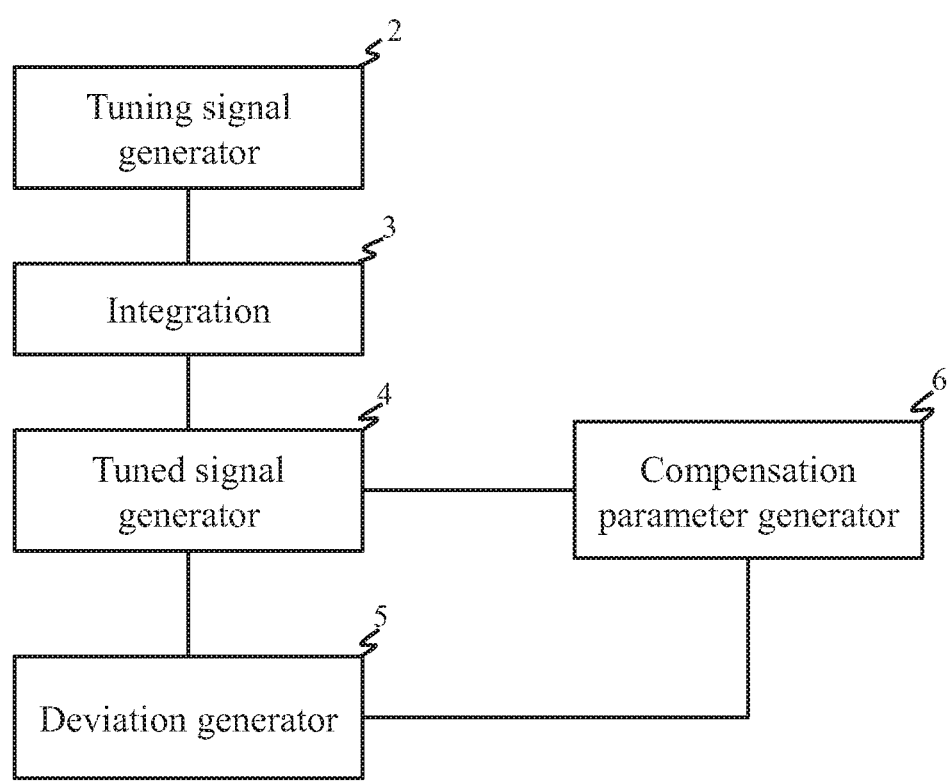
FIG. 3b is a diagram of the implementation of SDE magnitude and phase adaptive tuning in accordance with an embodiment of the present invention.

Refer to FIG. 3b, which shows a diagram of the implementation of SDE magnitude and phase adaptive tuning in accordance with an embodiment of the present invention.

Components in FIG. 3b can be corresponded to FIG. 3a. The tuning signal generator 2 includes the tuning signal generated units 201 and 202 for acquiring an estimated tuning signal. The integration 3 includes the integrators 203 and 204 for receiving, integrating, and outputting the estimated tuning signal to be the parameters h1 and h2. The tuned signal generator 4 comprises the calculation units 205 and 206 and the adder 207, which calculates the parameters h1 and h2 and outputs the tuned signals to the adder 207. The deviation generator 5 comprises the adder-subtracter 208 for calculating the second deviation value, and output the second deviation value to the tuning signal generated units 201, 202 and integrators 203, 204 to obtain another parameters h1 and h2. Finally, the compensation parameter generator 6 includes the compensation generator 209 connected to the integration value generator 4 and the deviation generator 5, which is used to calculate the magnitude estimation A and the phase estimation c.

In order to compensate the SDE effect in position feedback information from the laser measurement on continuous scanning operation in EBI system, the continuous scanning operation is divided into two sections. In the first section, the stage moving speed is constant, the magnitude and phase of the SDE vibration are estimated using an adaptive tuning law. The stable tuned parameters are fixed at the end of the first section where the SDE effect is not compensated. The second section is for continuous scanning. A compensation signal using the estimated magnitude and phase, and the calculated frequency is generated for the SDE vibration compensation. From the example illustration, this compensation scheme is effective for the SDE effect on continuous scanning operation in EBI system.

Figure 3C:
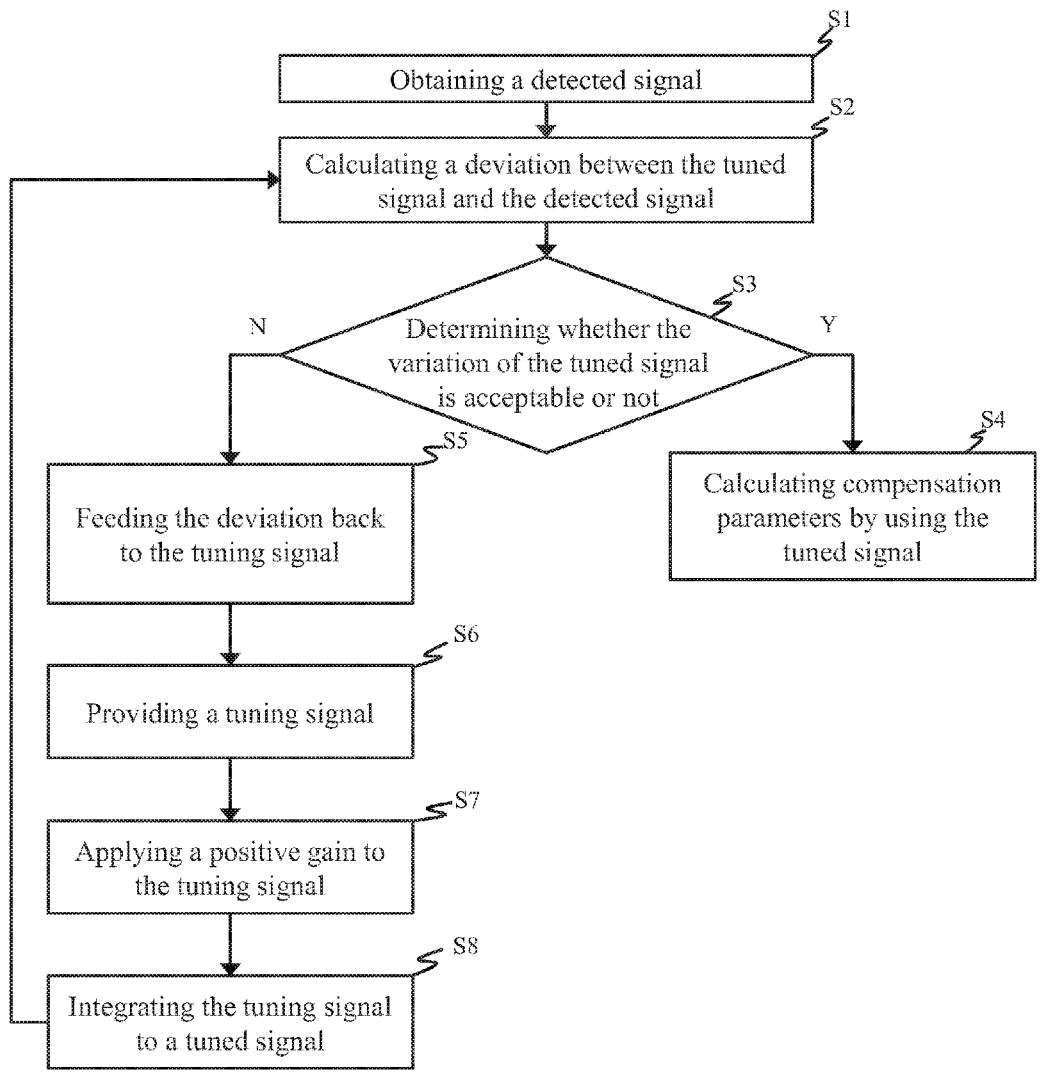
FIG. 3c is a flow chart of the implementation of SDE magnitude and phase adaptive tuning in accordance with an embodiment of the present invention.

The FIG. 3c illustrates the flow chart of the implementation of SDE magnitude and phase adaptive tuning in accordance with an embodiment of the present invention.

First, in the step S1, the raw input signal u is obtained from the laser interferometer after A/D conversion and interpolation. Next, in the step S2, the first deviation value between the raw input signal u and the original SDE single frequency vibration d is calculated. After that, the step S3 is processed, which shows the deviation value has to be determined whether it is acceptable or not by determining whether the variations of the tuned signal approach to the pre-determined value or not. If the deviation value is acceptable, the step S4 is processed, which means that the parameters h1 and h2 are output to the compensation generator 209 to calculate the magnitude estimation A and the phase estimation c. The calculated results from the magnitude estimation A and the phase estimation c can be applied for compensating the SDE effect. By contrast, if that the deviation value is not acceptable, the step S5 is processed, which means that the second deviation value is fed back to the tuning signal generated units 201, 202. Then, the step S6 is processed, which means the tuning signal generated units 201 and 202 generates the tuning signal according to the second deviation value. Next, the step S7 is processed, which shows that a positive gain is applied to the tuning signal. After that, the step S8 is processed, which means that the tuning signal is integrated to the tuned signal. Then, the steps S2~S3 are processed again till the variation of the tuned signal is acceptable.

Figure 5:
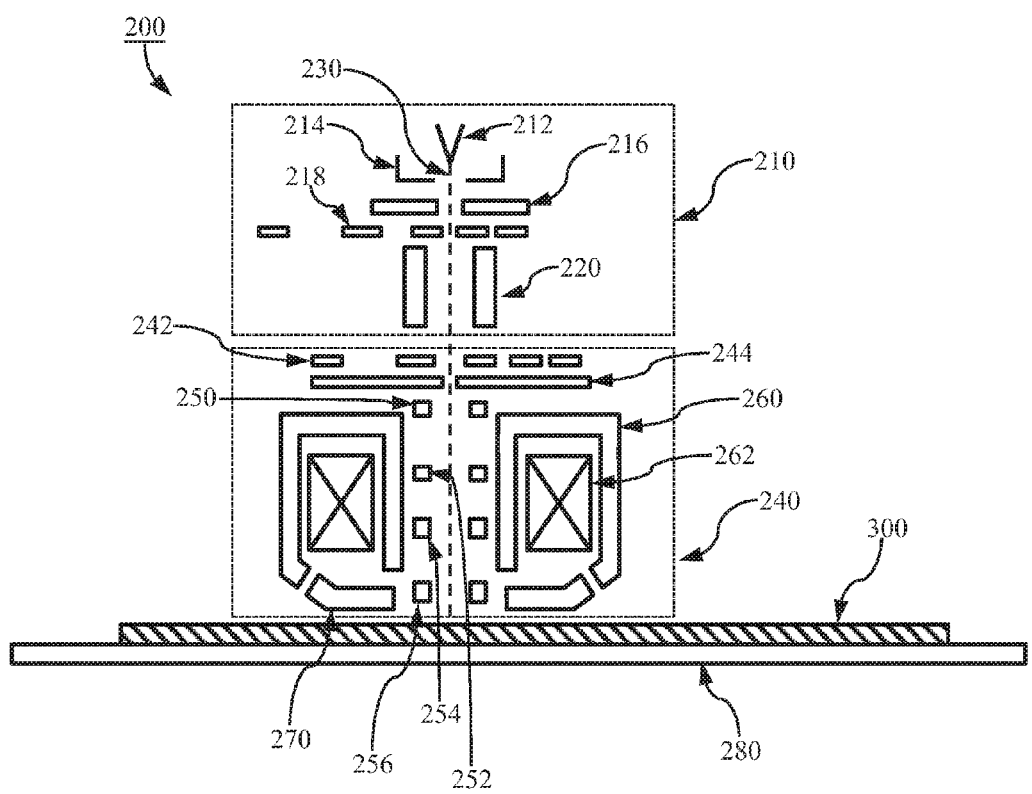
FIG. 5 illustrates a diagram of an ebeam inspection tool.
Figure 6:
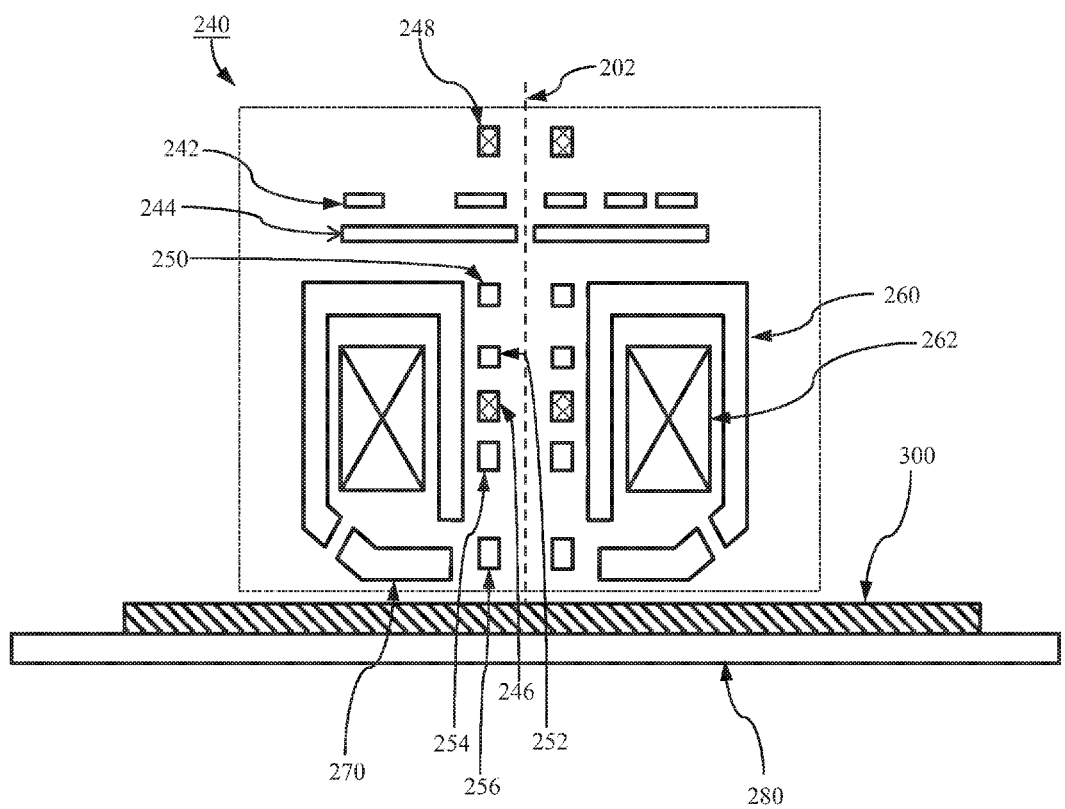
FIG. 6 illustrates the SORIL system of the ebeam inspection tool.

Please refer to the FIG. 5 and the FIG. 6. The FIG. 5 shows a diagram of an ebeam inspection tool, and the FIG. 6 shows a diagram of a swing objective retarding immersion lens (SORIL) system of the ebeam inspection tool.

As shown in the FIG. 5, the ebeam inspection tool 200 comprises an electron gun 210 and a SORIL system 240. The electron gun 210 comprises an electron source 212, suppressor 214, an anode 216, a set of apertures 218, and a condenser 220. The electron source 212 can be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bended to form a tip for placing the tungsten pin. Next, a ZrO2 is coated on the surface of the tungsten pin, and is heated to 1300° C. so as to be melted and cover the tungsten pin but uncover the pinpoint of the tungsten pin. The melted ZrO2 can make the work function of the tungsten lowered and decrease the energy barrier of the emitted electron, and thus the electron beam 230 is emitted efficiently. Then, by applying negative electricity to the suppressor 214, the electron beam 230 is suppressed. Accordingly, the electron beam having the large spread angle is suppressed to the primary electron beam 230, and thus the brightness of the electron beam 230 is enhanced.

By the positive charge of the anode 216, the electron beam 230 can be extracted, and then the Coulomb's compulsive force of the electron beam 230 may be controlled by using the tunable aperture 218 which has different aperture sizes for eliminating the unnecessary electron beam outside of the aperture. In order to condense the electron beam 230, the condenser 220 is applied to the electron beam 230, which also provides magnification. The condenser 220 shown in the FIG. 3 is an electrostatic lens which can condense the electron beam 230. On the other hand, the condenser 220 can be also a magnetic lens.

The FIG. 6 illustrates the SORIL system 240 which comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 230, and further has electrostatic lens function due to the combination of upper pole piece and sample 300. Besides, the coil 262 and the yoke 260 are configured to the magnetic objective lens.

The electron beam 230, described above, is generated by heating the electron pin and applying the electric field to anode 216, so that, in order to stabilize the electron beam 230, there must be a long time for heating the electron pin. For a user end, it is surely time consuming and inconvenient. Hence, the blanker 248 is applied to the condensed electron beam 230 for temporally deflecting the electron beam 230 away from the sample rather than turning off it.

The deflectors 250 and 256 are applied to scan the electron beam 230 to a large field of view, and the deflectors 252 and 254 are used for scanning the electron beam 230 to a small field of view. All the deflectors 250, 252, 254, and 256 can control the scanning direction of the electron beam 230. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 230, the retarder 270, the sample 300, and the upper pole piece form a lens to eliminate the chromatic aberration of the electron beam 230.

Besides, when the electron beam 230 bombards into the sample 300, a secondary electron will be emanated from the surface of the sample 300. Next the secondary electron is directed to the detector 244 by the filter 246.

Since the tuned signal is determined till it is acceptable, the SDE in the ebeam inspection tool is almost ideally compensated, and the influence of the stage vibration can be accordingly eliminated. Furthermore, when the inspection mode is continuous scan, the stage vibration is more obvious and severe to the scanning performance. Hence, by the means of the laser SDE effect compensation, the scanning results are still desirable, even if there's the stage vibration.

Although the present invention has been explained in relation to its preferred embodiment, it is to be understood that other modifications and variation can be made without departing the spirit and scope of the invention as hereafter claimed.

What is claimed is:

1. A method for calculating a compensation signal for a sub-divisional error in an object detection, comprising:
    obtaining a detected position of the object;
    applying a positive gain to a tuning signal;
    integrating the tuning signal to a tuned signal;
    calculating a deviation between the tuned signal and the detected position;
    feeding the deviation to the tuning signal when variations of the tuned signal do not approach to a pre-determined value; and
    calculating compensation parameters by using the tuned signal when the variations of the tuned signal approach to the pre-determined value.

2. The method according to claim 1, wherein when the variations of the tuned signal do not approach to the pre-determined value, another deviation is calculated.

3. The method according to claim 2, wherein the compensation parameters are fixed when the variation of the tuned signal approach to the pre-determined value.

4. The method according to claim 3, wherein the detected position of the object detection is obtained by using a laser interferometer and an A/D converter.

5. The method according to claim 3, wherein the fixed compensation parameters are used in a continuous scanning mode.

6. A method for compensating a sub-divisional error in an object detection, comprising:
    obtaining a detected position of the object;
    applying a positive gain to a tuning signal;
    integrating the tuning signal to a tuned signal;
    calculating a deviation between the tuned signal and the detected position;
    feeding the deviation to the tuning signal when variations of the tuned signal do not approach to a pre-determined value;
    calculating compensation parameters by using the tuned signal when variations of the tuned signal approach to the pre-determined value; and
    compensating the sub-divisional error by subtracting the compensation parameters from the sub-divisional error in the object detection.

7. The method according to claim 6, wherein when the variations of the tuned signal do not approach to the pre-determined value, another deviation is calculated.

8. The method according to claim 7, wherein the detected position of the object detection is obtained by using a laser interferometer and an A/D converter.

9. The method according to claim 7, wherein the compensation parameters are fixed when the variation of the tuned signal approach to the pre-determined value.

10. The method according to claim 9, wherein the fixed compensation parameters are used in a continuous scanning mode.

11. A system for calculating a sub-divisional error in a stage of a charged particle beam inspection tool, comprising:
    a parameter generator receiving a detected position and a sub-divisional error frequency, and generating a compensation parameter; and
    a signal generator receiving the compensation parameter from the parameter generator and sub-divisional error frequency to generate a compensation signal by using the tuned signal when variations of the tuned signal approach to a pre-determined value.

12. The system according to claim 11, wherein the parameter generator comprises;

a pair of signal generated units, which generates a pair of tuning signals according to the detected position and the sub-divisional error;
    a pair of integrators, integrating the tuning signals and generating two parameters;
    a calculation unit, which calculates tuned signals according to the parameters; and
    a compensation generator, which calculates compensation parameters by using the tuned signal when variations of the tuned signal approach to a pre-determined value.

13. The method according to claim 12, wherein when the variations of the tuned signal do not approach to the pre-determined value, another deviation is calculated.

14. The method according to claim 12, wherein the detected position of the object detection is obtained by using a laser interferometer and an A/D converter.

15. The method according to claim 12, wherein the compensation parameters are fixed when the variation of the tuned signal approach to the pre-determined value.

16. The method according to claim 15, wherein the fixed compensation parameters are used in a continuous scanning mode.

17. The method according to claim 16, wherein the charged particle beam inspection tool is an ebeam inspection tool.

* * * * *